(12) United States Patent
Stubbs

(10) Patent No.: US 7,925,284 B2
(45) Date of Patent: Apr. 12, 2011

(54) CHARGED PARTICLE BEAM DEVICE

(75) Inventor: Tim Robert Stubbs, Soham (GB)

(73) Assignee: Carl Zeiss SMT Limited (GB)

( * ) Notice: Subject to any disclaimer, the term of this patent is extended or adjusted under 35 U.S.C. 154(b) by 361 days.

(21) Appl. No.: 11/622,192

(22) Filed: Jan. 11, 2007

(65) Prior Publication Data

US 2007/0191036 A1 Aug. 16, 2007

(30) Foreign Application Priority Data

Jan. 12, 2006 (GB) .................................. 0600577.1

(51) Int. Cl.
*H04W 4/00* (2009.01)
(52) U.S. Cl. ...................... 455/466; 455/556.1; 455/557
(58) Field of Classification Search .................. 455/466; 850/9
See application file for complete search history.

(56) References Cited

U.S. PATENT DOCUMENTS

| 5,616,921 | A * | 4/1997 | Talbot et al. .................... 850/9 |
| 5,920,826 | A * | 7/1999 | Metso et al. .................... 455/466 |
| 6,822,232 | B1 | 11/2004 | Todokoro |
| 2001/0005675 | A1* | 6/2001 | Aho ................. 455/466 |
| 2002/0028399 | A1* | 3/2002 | Nakasuji et al. .............. 430/30 |
| 2002/0045442 | A1* | 4/2002 | Silen et al. .................. 455/466 |
| 2002/0113874 | A1* | 8/2002 | Schlafer ................. 348/143 |
| 2004/0051625 | A1 | 3/2004 | Nass |
| 2005/0045822 | A1 | 3/2005 | Onishi |
| 2007/0121651 | A1* | 5/2007 | Casey et al. .................. 370/401 |

FOREIGN PATENT DOCUMENTS

| CN | 1595947 A | 3/2005 |
| DE | 10351782 A1 | 6/2005 |
| GB | 2354909 A | 4/2001 |
| SE | 526710 C2 | 10/2005 |
| WO | WO-01/80200 A2 | 10/2001 |

OTHER PUBLICATIONS

Intellection Sift, Dec. 2005, Issue 4, pp. 1-8, see p. 4, center column.
Schmitt, "Fernwirken ubers Handy", Funkschau, Weka Fachzeitschriften Verlag, vol. 73, No. 9, Jun. 9, 2000, pp. 28-30.
European Search Report of Apr. 7, 2008 in EP 07250050.

* cited by examiner

*Primary Examiner* — Kent Chang
*Assistant Examiner* — Kashif Siddiqui
(74) *Attorney, Agent, or Firm* — Barnes & Thornburg LLP

(57) ABSTRACT

A charged particle beam device (10) is provided, including a computer operable in response to commands entered by a user of the device to control the device, wherein the device further includes an interface (24) operable to cause data from the computer in the form of short message service (SMS) and/or multimedia message service (MMS) messages to be transmitted to a mobile device (16, 18, 20) via a mobile telephone network (14). The charged particle beam device (10) is operable to receive commands in the form of SMS and/or MMS messages from the mobile telephone (14), and to cause the computer to execute the commands. The interface (24) includes a user interface operable to enable a user of the device to select operating parameters and/or conditions of the device from a list of operating parameters and/or conditions, set values of each selected operating parameter or condition in response to which the interface will transmit an SMS message to a mobile device, and for each selected operating parameter or condition, enter an identification, typically a telephone number, of the mobile device to which the SMS message will be transmitted.

34 Claims, 2 Drawing Sheets

CHARGED PARTICLE BEAM DEVICE

FIELD OF THE INVENTION

This invention relates to charged particle beam devices, particularly but not exclusively to electron microscopes and focused ion beam systems.

BACKGROUND TO THE INVENTION

A known electron microscope includes a computer operable to monitor and adjust various operating parameters of the microscope, such as an accelerating voltage (EHT) used to accelerate electrons in the microscope. The computer is operable to adjust the operating parameters in accordance either with a control algorithm or commands entered by a user of the microscope.

The computer can communicate with another computer via the Internet. The user can operate the microscope from the other computer, which can be remote from the microscope. However, this requires both computers to be connected to the Internet, and a continuous connection between the computers to be maintained.

The operations carried out by an electron microscope can take many hours to complete. For example, x-ray scanning of a mineral sample can take twenty hours or more. Some microscopes include a focused ion beam (FIB) column for milling (i.e. using an ion beam to remove layers of a specimen). Milling operations can take several hours to complete. At present the user must initiate an operation at the microscope or at the other computer, then return to the microscope or to the other computer from time to time to determine whether the microscope has completed the operation, or whether a fault has occurred that has prevented completion of the operation.

SUMMARY OF THE INVENTION

According to the invention there is provided a charged particle beam device including a computer operable in response to commands entered by a user of the device to control the device, wherein the device further includes an interface operable to cause data from the computer to be transmitted in the form of short message service (SMS) and/or multimedia message service (MMS) messages to a mobile device via a mobile telephone network.

In this specification "mobile device" means a device operable to receive and display SMS and/or MMS messages from a mobile telephone network. Such devices include mobile telephones and some personal digital assistants (PDAs).

Most people nowadays have a mobile telephone and are familiar with SMS and MMS messages. A mobile device such as a mobile telephone does not need to be programmed, or to have any software installed on it, by the user, in order to be able to receive SMS and MMS messages. This makes such mobile devices ideal for use to notify a user of events relating to a charged particle beam device.

The invention can provide a charged particle beam device that is operable to notify a user who is not in the immediate vicinity of the device of events relating to the device, such as the completion of an operation by the device, or the occurrence of a fault that has interrupted operation of the device, by means of a mobile device of the user.

Use of the mobile device of the user to notify the user of events relating to the charged particle beam device avoids the need for a continuous connection to be maintained between the charged particle beam device and the mobile device. The charged particle beam device has no need to establish the location of the user to notify him because this is done by the mobile telephone network.

Moreover, use of the mobile device of the user and the mobile telephone network to notify the user of events relating to the charged particle beam device means that there is no need for the security protocols that would be necessary if the notification were provided via the Internet.

Preferably the interface is operable to cause the data to be transmitted to the mobile device via a Global System for Mobile Communications (GSM) mobile telephone network. The interface may advantageously be operable to receive commands in the form of SMS and/or MMS messages from the mobile telephone network, and to cause the computer to execute the commands.

The invention can further provide a charged particle beam device that can be controlled by a user who is not in the immediate vicinity of the device, by transmission of commands, such as commands to start up or shut down, to the interface by means of the mobile device of the user.

The interface may advantageously be adapted for communication with a data transceiver operable to transmit the data to the mobile device via the mobile telephone network.

The data transceiver might for example be another mobile device or simply a modem card, such as a GSM PCMCIA modem card.

Where the interface is adapted for communication with a data transceiver, the interface is preferably further operable to receive commands in the form of SMS and/or MMS messages from the data transceiver, the commands being received by the data transceiver from the mobile telephone network, and to cause the computer to execute the commands.

The interface may advantageously be adapted for communication with the data transceiver by connection to the data transceiver, for example by means of a Universal Serial Bus (USB), serial or local area network (LAN) connection.

Preferably the interface is adapted for wireless communication with the data transceiver, for example in accordance with the Bluetooth or Wi-Fi protocol.

Alternatively or additionally, the interface may advantageously be adapted for communication with a host computer by means of the Internet, the host computer being operable to transmit the data to the mobile device via the mobile telephone network.

The host computer would typically be used to implement an application programming interface (API) to allow transmission and reception of SMS and/or MMS messages by the host computer, examples of such APIs being MSN Messenger, ActiveX[COM], XML and .NET.

Where the interface is adapted for communication with a host computer, the interface is preferably operable to receive commands in the form of SMS and/or MMS messages from the host computer, the commands being received by the host computer from the mobile telephone network, and to cause the computer of the device to execute the commands.

The interface may advantageously be operable to cause data from the computer of the device to be transmitted to a plurality of mobile devices via the mobile telephone network.

In this way several other users, who are waiting to use the device, could be informed that the device has completed an operation initiated by a first user, and is available for use by the other users.

Preferably the interface is operable to cause data from the computer to be transmitted to a first mobile device in response to occurrence of a first event relating to the device, and to a second mobile device in response to occurrence of a second event relating to the device.

By way of example, in response to completion of an operation by the device, the interface might cause an SMS message indicating that the device is available for use to be transmitted to the mobile device of a user of the device, whereas in response to detection of occurrence of a fault with the device, the interface might cause an SMS message indicating the nature of the fault to be transmitted to the mobile device of a service engineer. If the fault is such as to interrupt the operation of the device, the interface might additionally cause an SMS message indicating that completion of the operation will be delayed to be transmitted to the mobile device of the user of the device.

The interface preferably includes a user interface operable to enable a user of the device to select operating parameters and/or conditions of the device from a list of operating parameters and/or conditions, set values of each selected operating parameter or condition in response to which the interface will transmit an SMS message to a mobile device, and for each selected operating parameter or condition, enter an identification, typically a telephone number, of the mobile device to which the SMS message will be transmitted.

Preferably the user interface is a windowed dialog system.

Such an operating condition might for example be percentage completion of an operation of the device, so that in order to be notified of completion of an operation of the device, the user would use the user interface to select percentage completion from the list of operating parameters, set a value of 100% for percentage completion, and enter the telephone number of his mobile device.

Preferably the user interface is further operable to enable a user of the device to enter a text string for each of the selected operating parameters or conditions, which text string will be included in the SMS message sent to the mobile device identified in connection with that parameter or condition.

Thus for example, where the device is an electron microscope, the user interface could be used to select a condition that a filament of an electron column of the microscope has failed, to enter the telephone number of the mobile device of a service engineer, and to enter a text string such as "SEM23574—replace filament" to be transmitted as an SMS message to the mobile device of the service engineer in the event of failure of the filament.

The user interface may advantageously be operable to enable a user to compose a message for transmission by the interface to the mobile device. The user interface may advantageously further be operable to display a SMS or MMS message received by the interface from the mobile device. In this way a user in the immediate vicinity of the device can communicate conveniently with a user who is not in the immediate vicinity of the device.

The user interface is preferably operable to enable a user of the device to select commands from a list of commands executable by the device, and for each selected command, to enter a text string corresponding to the command, and the interface is further operable in response to receipt of an SMS message containing the text string to cause the computer to execute the corresponding command.

Such commands executable by the computer might include commands to start up or shut down the device, the text strings corresponding to these commands being, for example, "start" and "stop" respectively.

Where the device is operable to produce an image of a specimen, as is the case with an electron microscope, for example, the commands executable by the device preferably include a command to convert an image of the specimen produced by the device to an MMS message, and to transmit the MMS message to a mobile device. The text string corresponding to this command might for example be "get image". Thus a user not in the immediate vicinity of the device can transmit an SMS message containing the text string "get image" to the interface of the device using his mobile device, and his mobile device will receive an MMS message containing an image of a specimen from the interface of the device.

This process of assigning simple text strings to commands from a list of commands executable by the device makes the device very simple to operate remotely using a mobile device, because it avoids the need for any software to be installed on the mobile device.

Where the device is operable to modify a specimen, as in the case of a focused ion beam device operable to mill a specimen i.e. remove layers or portions of layers from the specimen, the interface is preferably operable to receive an MMS message from a mobile device containing an image of a milling pattern, and to cause the computer to control the device so as to mill the milling pattern into the specimen.

Preferably the device is an electron microscope, and more preferably still a scanning electron microscope (SEM).

BRIEF DESCRIPTION OF THE DRAWING FIGURES

The invention will now be described by way of illustrative example and with reference to the accompanying drawings, in which.

DETAILED DESCRIPTION OF AN EMBODIMENT

Figure 1:
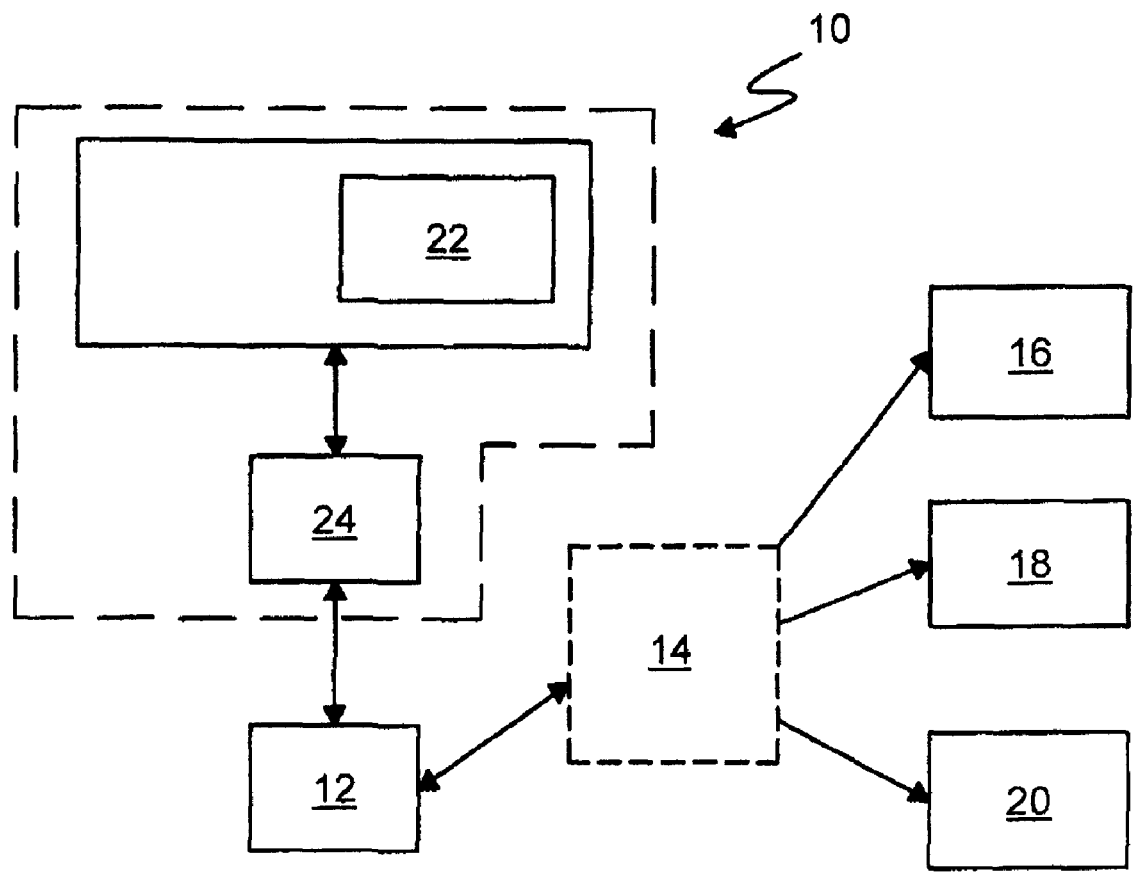
FIG. 1 is a block diagram of a communication network including a scanning electron microscope (SEM) in accordance with the invention.

The communication network of FIG. 1 comprises a scanning electron microscope (SEM) 10, a local mobile telephone 12 wirelessly connected in accordance with the Bluetooth protocol to the SEM 10, a GSM mobile telephone network 14 and first, second and third remote mobile telephones denoted by reference numerals 16, 18 and 20 respectively.

The SEM 10 is of conventional construction and operation, in that it has a beam generating column in which a beam of electrons is generated, shaped and focused by means of controlled electrostatic and/or magnetic fields, and scanned across a specimen to be analysed. The SEM also includes control software 22 executable by a computer (not shown) to control the operation of the SEM, and a focused ion beam (FIB) column (not shown). The SEM also includes an interface 24, which is wirelessly connected to the local mobile telephone 12, as explained above. The SEM 10 is described in greater detail below with reference to FIG. 3.

The control software 22 monitors and modifies the operating parameters and conditions of the SEM such as accelerating voltage of the electron optical column that produces the electron beam, deflection of the electron beam relative to a specimen, pressure in the specimen chamber, progress through a milling list carried out on the specimen by the FIB column, and accelerating voltage of a secondary electron detector.

The interface 24 includes application programming interface software that interfaces with the control software 22. The interface 24 displays in a windowed dialog system a list of the operating parameters and conditions monitored by the control software 22. A user of the SEM can select any of the operating parameters and conditions monitored by the control software 22 in the windowed dialog system and enter a trigger value of that parameter or condition that will trigger a notification. In the description that follows, the event of a parameter or condition reaching a trigger value of that parameter or condition will be referred to as a "trigger event". For the parameter of the pressure in the specimen chamber, for example, the user might enter a trigger value that, if reached by the pressure in the specimen chamber, would indicate a fault with the vacuum system of the SEM, so that if the pressure in the specimen chamber reaches that trigger value, it will trigger a notification.

For each selected operating parameter or condition, the user enters a mobile telephone number to which a notification SMS message will be sent in the event of a trigger event. The user can also enter a time range, for example 08.00 to 18.30, when the notification is allowed to occur. If a trigger event occurs outside this time range, the notification will not be triggered. This enables a user of the SEM to ensure that a notification is not sent to his mobile device at inconvenient times, for example, when he is at home.

For each entered trigger event, the user also enters a text string to be included in the notification if the trigger event occurs. In the example above of the trigger value of the pressure in the specimen chamber indicative of a fault with the vacuum system of the SEM, the text string might be "warning—high specimen chamber pressure". The selected operating parameters and conditions, mobile telephone numbers, time ranges (if any) and text strings are stored on the hard drive of the computer of the SEM.

In the event of a trigger value of an operating parameter or condition being reached, the interface retrieves the mobile telephone number and text string associated with that trigger value from the hard disc drive of the computer of the SEM and transmits a signal to the local mobile telephone 12 that causes it to transmit an SMS message containing the text string to the mobile telephone number.

In FIG. 1 remote mobile telephone 16 is the telephone of a first user of the SEM and remote mobile telephone 18 is the telephone of a second user of the SEM. Remote mobile telephone 20 is the telephone of a service engineer responsible for maintenance of the SEM.

The list of operating parameters and conditions includes detectable fault conditions such as failure of the filament of the electron optical column of the SEM. The windowed dialog system would typically be used to select the fault condition of failure of the filament and the telephone number of the telephone 20 of the service engineer entered. The text string for transmission to the telephone of the service engineer in the event of failure of the filament can include identification of the SEM, such as a serial number of the SEM, where the service engineer is responsible for maintenance of several SEMs. This is not essential, however, because the local mobile telephone has a unique telephone number, which can be used by the service engineer to identify the SEM, provided that his mobile telephone 20 is operable to display the telephone number of mobile devices from which it has received an SMS message.

The interface 24 also displays in the windowed dialog system a list of commands executable by the control software 22. These commands include commands to start up and shut down the SEM, to vent the specimen chamber of the SEM and to produce an image of the specimen. The user of the SEM can select any of the commands and enter a text string in response to receipt of which in an SMS message the interface 24 will carry out the corresponding command.

For example, the user might select the command to start up the SEM and enter the text string "start". He can then use his remote mobile telephone to transmit an SMS message containing the text string "start" to the local mobile telephone 12. Upon receipt of the SMS message the local mobile telephone 12 transmits the SMS message to the interface 24, which identifies the text string "start" in the SMS message and causes the computer of the SEM to start up the SEM. Starting up the SEM can take 20 to 30 minutes, so this enables the user to start up the SEM during his journey to work, so that the SEM is ready for use upon his arrival at work.

The user might also select the command to produce an image of the specimen and enter the text string "get image". He can then use his remote mobile telephone 16 to transmit an SMS message containing the text string "get image" to the local mobile telephone 12. Upon receipt of the SMS message the local mobile telephone 12 transmits the SMS message to the interface 24, which identifies the text string "get image" in the SMS message and causes the computer to obtain an image of the specimen and transmit it to the interface 24. The interface 24 then converts the image into a form suitable for transmission as an MMS message, and transmits the MMS message to the local mobile telephone 12, which transmits the MMS message to the remote mobile telephone 16 of the user.

For security purposes the user can also enter one or more telephone numbers for each selected command, the telephone numbers being those of remote mobile telephones from which the user wishes the SEM to be able to receive commands. Upon receiving an SMS message containing a text string associated with a command executable by the computer, the interface determines whether the telephone number of the remote mobile telephone from which the SMS message has been received is one of the telephone numbers entered for that command, and causes the computer to execute the command only if it is so determined.

Figure 2:
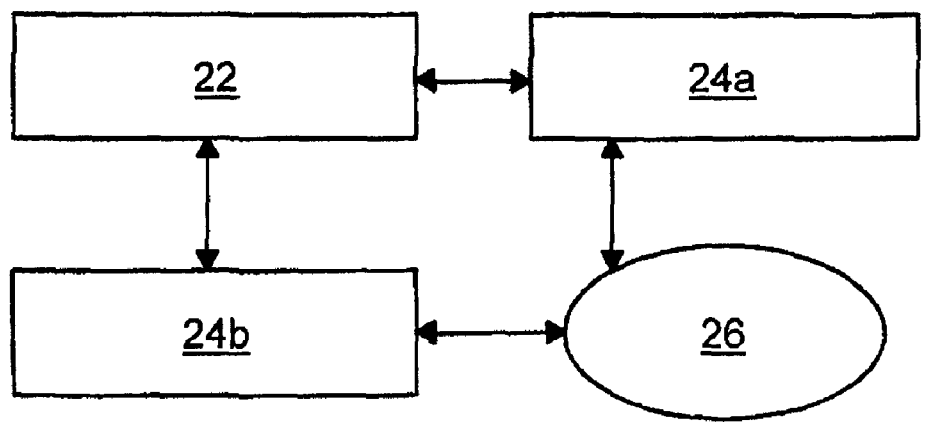
FIG. 2 is a functional block diagram of the computer system of the SEM of FIG. 1.

Turning to FIG. 2, the computer system of the SEM can be regarded as comprising four functional blocks, namely the control software 22 of the SEM, a trigger event definition module 24a, a trigger event and command processing monitoring module 24b and a hard drive 26 on which the selected trigger events, commands, text strings and mobile telephone number or numbers for each selected trigger event or command are stored.

The trigger event module 24a is accessed by the user through the windowed dialog system as explained above and obtains the list of controllable parameters, conditions and executable commands from the control software 22. The mobile telephone numbers and text strings entered by the user into the trigger event module are stored by the trigger event module 24a on the hard drive 26. The trigger event and command processing monitoring module 24b is wirelessly connected to the local mobile telephone 12 and monitors the controllable parameters and conditions of the control software 22, and responds to trigger events by retrieving the relevant text string and mobile telephone number from the hard drive 26, composing an SMS message containing the text string and causing the local mobile telephone 12 to transmit the SMS message to the mobile telephone number.

The trigger event and command processing monitoring module 24b also monitors the SMS messages received by the local mobile telephone 12, and each time an SMS message is received, searches the hard drive 26 to determine whether the SMS message contains a text string corresponding to a command executable by the control software, checks the hard drive, if required, to determine whether the SMS message has been received from a mobile telephone from which that command is to be accepted, and, if so, causes the control software to carry out the command.

Figure 3:
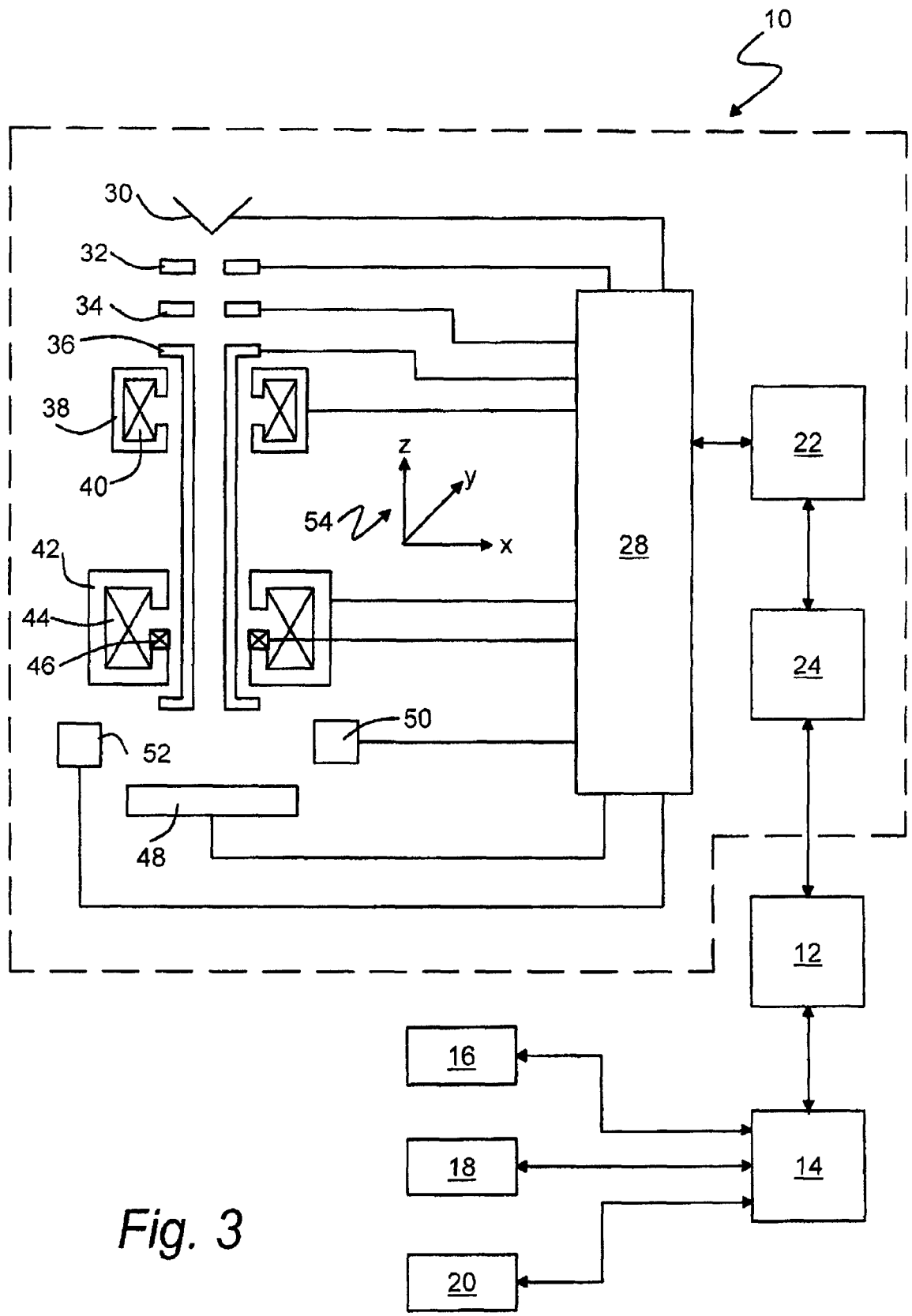
FIG. 3 is a schematic diagram of the SEM and communication network of FIG. 1, showing the SEM in more detail.

FIG. 3 shows the SEM 10, local mobile telephone 12, GSM mobile telephone network 14 and first, second and third remote mobile telephones 16, 18 and 20.

In addition to the control software 22 and interface 24, the SEM 10 comprises a controller 28, an electron emitter 30, an extraction electrode 32, a control (Wehnelt) electrode 34, an anode 36, a condenser lens 38 including a magnetic coil 40, an objective lens 42 including a magnetic coil 44, a scanning coil 46, a specimen stage 48, an electron detector 50 and a pressure sensor 52.

The controller 28 is operable to control the voltage of the electron emitter 30, as well as the voltages of the electrodes 32, 34 and 36. The controller 28 is also operable to control the currents of the condenser lens coil 40 and the objective lens coil 44, as well as the current of the scanning coil 46. The controller 28 can determine the region of a specimen on the specimen stage 48 that is scanned by the electron beam by control of the current of the scanning coil 46. The controller 28 is also operable to control an actuator to move the specimen stage 48 in any of three mutually perpendicular directions, shown in FIG. 3 and denoted by reference numeral 54, so as to select that region of the specimen of which an image is to be generated. The controller 28 generates the image using signals from the electron detector 50, which signals are transmitted to the controller by the detector 50.

The pressure sensor 52 transmits signals representative of the pressure in the specimen chamber (not shown) of the SEM to the controller 28, which transmits the signals to the control software so as to enable the control software to detect a trigger value of the pressure in the specimen chamber if a fault develops in the vacuum system of the SEM, because such a fault will give rise to an increase in pressure in the specimen chamber.

The control software 22, interface 24 and controller 28 are therefore operable to notify a user of the SEM via his mobile telephone of any chosen value of the parameters of the SEM, such as specimen chamber pressure and electron detector signal, that are monitored by the controller 28. The control software 22, interface 24 and controller 28 are also operable to adjust any of the parameters such as electrode voltages, coil currents and specimen stage position in response to commands transmitted to the SEM by the user of the SEM using his mobile telephone.

It will be appreciated that the foregoing description relates only to one embodiment of the invention and that the invention encompasses other embodiments as defined by the foregoing statements of the invention.

The invention claimed is:

1. A charged particle beam device including a computer operable in response to commands entered by a user of the device to control the device, wherein the device further includes an interface operable to cause data from the computer to be transmitted in the form of short message service (SMS) and/or multimedia message service (MMS) messages to a plurality of mobile devices via a mobile telephone network, the interface being operable to cause data from the computer to be transmitted to a first mobile device in response to occurrence of a first event relating to the charged particle beam device, and to a second mobile device in response to occurrence of a second event relating to the charged particle beam device, wherein the first event comprises the completion or partial completion of an operation by the charged particle beam device, wherein the device further comprises a charged particle source, a charged particle optical system for forming charged particles from said source into a beam and a scanning device operable to scan a specimen with said beam, wherein the first event comprises the completion or partial completion of a scanning operation on said specimen.

2. A charged particle beam device according to claim 1, wherein, in response to occurrence of the first event, a message is sent to the first mobile device, being the mobile device of a user of the particle beam device, and wherein the second event is the detection of the occurrence of a fault in the particle beam device, causing the interface to transmit a message to the second mobile device, being the mobile device of a service engineer.

3. A charged particle beam device according to claim 2 in which said fault is such as to interrupt the operation of the device.

4. A device according to claim 1, wherein the interface is operable to cause the data to be transmitted to the mobile device via a Global System for Mobile Communications (GSM) mobile telephone network.

5. A device according to claim 1, wherein the interface is operable to receive commands in the form of SMS and/or MMS messages from the mobile telephone network, and to cause the computer to execute the commands.

6. A device according to claim 1, wherein the interface is adapted for communication with a data transceiver operable to transmit the data to the mobile device via the mobile telephone network.

7. A device according to claim 6, wherein the interface is further operable to receive commands in the form of SMS and/or MMS messages from the data transceiver, the commands being received by the data transceiver from the mobile telephone network, and to cause the computer to execute the commands.

8. A device according to claim 6, wherein the interface is adapted for communication with the data transceiver by connection to the data transceiver.

9. A device according to claim 6, wherein the interface is adapted for wireless communication with the data transceiver.

10. A device according to claim 1, wherein the interface is adapted for communication with a host computer by means of the Internet, the host computer being operable to transmit the data to the mobile device via the mobile telephone network.

11. A device according to claim 10, wherein the interface is operable to receive commands in the form of SMS and/or MMS messages from the host computer, the commands being received by the host computer from the mobile telephone network, and to cause the computer of the device to execute the commands.

12. A device according to claim 1, wherein the interface includes a user interface operable to enable a user of the device to select operating parameters and/or conditions of the device from a list of operating parameters and/or conditions, set values of each selected operating parameter or condition in response to which the interface will transmit an SMS message to a mobile device, and for each selected operating parameter or condition, enter an identification of the mobile device to which the SMS message will be transmitted.

13. A device according to claim 12, wherein the user interface is a windowed dialog system.

14. A device according to claim 9, wherein the user interface is further operable to enable a user of the device to enter a text string for each of the selected operating parameters or conditions, which text string will be included in the SMS message sent to the mobile device identified in connection with that parameter or condition.

15. A device according to claim 12, wherein the user interface is operable to enable a user of the device to select commands from a list of commands executable by the device, and for each selected command, to enter a text string corresponding to the command, and the interface is further operable in response to receipt of an SMS message containing the text string to cause the computer to execute the corresponding command.

16. A device according to claim 15, wherein the device is operable to produce an image of a specimen and the commands executable by the device include a command to convert an image of the specimen produced by the device to an MMS message, and to transmit the MMS message to a mobile device.

17. A device according to claim 5, wherein the device is operable to modify a specimen and the interface is operable to receive an MMS message from a mobile device containing an image of a milling pattern, and to cause the computer to control the device so as to mill the milling pattern into the specimen.

18. A device according to claim 1, wherein the device is a scanning electron microscope (SEM).

19. A charged particle beam device including a computer operable in response to commands entered by a user of the device to control the device, wherein the device further includes an interface operable to cause data from the computer to be transmitted in the form of short message service (SMS) and/or multimedia message service (MMS) messages to a plurality of mobile devices via a mobile telephone network, the interface being operable to cause data from the computer to be transmitted to a first mobile device in response to occurrence of a first event relating to the charged particle beam device, and to a second mobile device in response to a second event relating to the charged particle beam device, wherein, in response to the occurrence of the first event, a message is sent to the first mobile device, being the mobile device of a user of the particle beam device, and wherein the second event is the detection of the occurrence of a fault in the particle beam device, causing the interface to transmit a message to the second mobile device, being the mobile device of a service engineer, and wherein the charged particle beam device is a scanning electron microscope having an electron column which includes a filament, the second event being the detection of the failure of that filament, the message to the service engineer's mobile device informing the engineer of the need to replace the filament.

20. A charged particle beam device including a computer operable in response to commands entered by a user of the device to control the device, wherein the device further includes an interface operable to cause data from the computer to be transmitted in the form of short message service (SMS) and/or multimedia message service (MMS) messages to a plurality of mobile devices via a mobile telephone network, the interface being operable to cause data from the computer to be transmitted to a first mobile device in response to occurrence of a first event relating to the charged particle beam device, and to a second mobile device in response to a second event relating to the charged particle beam device, wherein, in response to the occurrence of the first event, a message is sent to the first mobile device, being the mobile device of a user of the particle beam device, and wherein the second event is the detection of the occurrence of a fault in the particle beam device, causing the interface to transmit a message to the second mobile device, being the mobile device of a service engineer, and wherein the charged particle beam device is an electron microscope having a vacuum system specimen chamber and a pressure sensor for monitoring the pressure in the specimen chamber, the second event being the detection by the sensor of the pressure in the chamber reaching a trigger value indicative of a fault in the vacuum system.

21. A charged particle beam device including a computer operable in response to commands entered by a user of the device to control the device, wherein the device further includes an interface operable to cause data from the computer to be transmitted in the form of short message service (SMS) and/or multimedia message service (MMS) messages to a plurality of mobile devices via a mobile telephone network, the interface being operable to cause data from the computer to be transmitted to a first mobile device in response to occurrence of a first event relating to the charged particle beam device, and to a second mobile device in response to occurrence of a second event relating to the charged particle beam device, wherein the first event comprises the completion or partial completion of an operation by the charged particle beam device, wherein the device is operable to produce an image of a specimen, the first event comprising the completion or partial completion of an imaging operation by the device.

22. A device according to claim 21, wherein the interface is operable to receive commands in the form of SMS and/or MMS messages from the mobile telephone network, and to cause the computer to execute the commands.

23. A device according to claim 21, wherein the interface includes a user interface operable to enable a user of the device to select operating parameters and/or conditions of the device from a list of operating parameters and/or conditions, set values of each selected operating parameter or condition in response to which the interface will transmit an SMS message to a mobile device, and for each selected operating parameter or condition, enter an identification of the mobile device to which the SMS message will be transmitted.

24. A device according to claim 23, wherein the user interface is further operable to enable a user of the device to enter a text string for each of the selected operating parameters or conditions, which text string will be included in the SMS message sent to the mobile device identified in connection with that parameter or condition.

25. A device according to claim 23, wherein the user interface is operable to enable a user of the device to select commands from a list of commands executable by the device, and for each selected command, to enter a text string corresponding to the command, and the interface is further operable in response to receipt of an SMS message containing the text string to cause the computer to execute the corresponding command.

26. A device according to claim 25, wherein the device is operable to produce an image of a specimen and the commands executable by the device include a command to convert an image of the specimen produced by the device to an MMS message, and to transmit the MMS message to a mobile device.

27. A device according to claim 22, wherein the device is operable to modify a specimen and the interface is operable to receive an MMS message from a mobile device containing an image of a milling pattern, and to cause the computer to control the device so as to mill the milling pattern into the specimen.

28. A charged particle beam device including a computer operable in response to commands entered by a user of the device to control the device, wherein the device further includes an interface operable to cause data from the computer to be transmitted in the form of short message service (SMS) and/or multimedia message service (MMS) messages to a plurality of mobile devices via a mobile telephone network, the interface being operable to cause data from the computer to be transmitted to a first mobile device in response to occurrence of a first event relating to the charged particle beam device, and to a second mobile device in response to occurrence of a second event relating to the charged particle beam device, wherein the first event comprises the completion or partial completion of an operation by the charged particle beam device, wherein the device is a focused ion beam device operable to mill a specimen, the first event comprising the completion or partial completion of a milling operation by the device.

29. A device according to claim 28, wherein the interface is operable to receive commands in the form of SMS and/or MMS messages from the mobile telephone network, and to cause the computer to execute the commands.

30. A device according to claim 28, wherein the interface includes a user interface operable to enable a user of the device to select operating parameters and/or conditions of the device from a list of operating parameters and/or conditions, set values of each selected operating parameter or condition in response to which the interface will transmit an SMS message to a mobile device, and for each selected operating parameter or condition, enter an identification of the mobile device to which the SMS message will be transmitted.

31. A device according to claim 30, wherein the user interface is further operable to enable a user of the device to enter a text string for each of the selected operating parameters or conditions, which text string will be included in the SMS message sent to the mobile device identified in connection with that parameter or condition.

32. A device according to claim 30, wherein the user interface is operable to enable a user of the device to select commands from a list of commands executable by the device, and for each selected command, to enter a text string corresponding to the command, and the interface is further operable in response to receipt of an SMS message containing the text string to cause the computer to execute the corresponding command.

33. A device according to claim 32, wherein the device is operable to produce an image of a specimen and the commands executable by the device include a command to convert an image of the specimen produced by the device to an MMS message, and to transmit the MMS message to a mobile device.

34. A device according to claim 29, wherein the device is operable to modify a specimen and the interface is operable to receive an MMS message from a mobile device containing an image of a milling pattern, and to cause the computer to control the device so as to mill the milling pattern into the specimen.

* * * * *